United States Patent
Varghese

(10) Patent No.: US 11,152,373 B1
(45) Date of Patent: Oct. 19, 2021

(54) STRUCTURES AND METHODS FOR FORMING DYNAMIC RANDOM-ACCESS DEVICES

(71) Applicant: Applied Materials, Inc., Santa Clara, CA (US)

(72) Inventor: Sony Varghese, Manchester, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/868,851

(22) Filed: May 7, 2020

(51) Int. Cl.
*H01L 27/108* (2006.01)
*H01L 21/265* (2006.01)
*H01L 21/3065* (2006.01)
*H01L 21/308* (2006.01)

(52) U.S. Cl.
CPC .. *H01L 27/10876* (2013.01); *H01L 21/26513* (2013.01); *H01L 21/26586* (2013.01); *H01L 21/308* (2013.01); *H01L 21/3065* (2013.01); *H01L 27/10814* (2013.01); *H01L 27/10823* (2013.01); *H01L 27/10855* (2013.01); *H01L 27/10885* (2013.01); *H01L 27/10891* (2013.01)

(58) Field of Classification Search
CPC ......... H01L 27/10876; H01L 27/10885; H01L 27/10891; H01L 21/26513; H01L 27/10855; H01L 21/26586; H01L 21/308; H01L 27/10814; H01L 27/10823; H01L 21/3065
See application file for complete search history.

(56) References Cited

U.S. PATENT DOCUMENTS

| | | |
|---|---|---|
| 2011/0018045 A1 | 1/2011 | Forbes |
| 2011/0284942 A1* | 11/2011 | Dong ............... H01L 29/78 257/314 |
| 2012/0009748 A1 | 1/2012 | Ji |
| 2012/0064704 A1 | 3/2012 | Kim |
| 2012/0112270 A1 | 5/2012 | Park et al. |
| 2020/0027832 A1 | 1/2020 | Varghese et al. |
| 2021/0125994 A1 | 4/2021 | Varghese et al. |

OTHER PUBLICATIONS

Y. Cho et al., "Suppression of the Floating-Body Effect of Vertical-Cell DRAM With the Buried Body Engineering Method," in IEEE Transactions on Electron Devices, vol. 65, No. 8, pp. 3237-3242, Aug. 2018, 6 pages.

(Continued)

*Primary Examiner* — David Vu
(74) *Attorney, Agent, or Firm* — Kacvinsky Daisak Bluni PLLC

(57) ABSTRACT

Disclosed are DRAM devices and methods of forming DRAM devices. One non-limiting method may include providing a device, the device including a plurality of angled structures formed from a substrate, a bitline and a dielectric between each of the plurality of angled structures, and a drain disposed along each of the plurality of angled structures. The method may further include providing a plurality of mask structures of a patterned masking layer over the plurality of angled structures, the plurality of mask structures being oriented perpendicular to the plurality of angled structures. The method may further include etching the device at a non-zero angle to form a plurality of pillar structures.

20 Claims, 12 Drawing Sheets

(56) References Cited

OTHER PUBLICATIONS

Ying Wang et al., "High performance of junctionless MOSFET with asymmetric gate"; https://doi.org/10.1016/j.spmi.2016.06.003; https://www.sciencedirect.com/science/article/pii/S0749603616302555, 7 pages.
International Search Report and Written Opinion dated Jul. 15, 2021, for the International Patent Application No. PCT/US2021/024364, filed Mar. 26, 2021, 6 pages.

\* cited by examiner

STRUCTURES AND METHODS FOR FORMING DYNAMIC RANDOM-ACCESS DEVICES

FIELD

The present embodiments relate to semiconductor devices, and more particularly, to $4F^2$ dynamic random-access devices and approaches for forming.

BACKGROUND

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 30:1 or more in the coming years.

In an effort to continue scaling smaller, $4F^2$ DRAM devices have been developed. However, current $4F^2$ DRAM devices have off-leakage current issues for vertical channel transistors. The off-leakage current results from the floating body effect caused by hole accumulation into the body of the $4F^2$ DRAM device. Furthermore, significant challenges exist for creating an asymmetric drain for node since the area of silicon has been reduced. With respect to these and other considerations, the present disclosure is provided.

SUMMARY OF THE DISCLOSURE

The Summary is provided to introduce a selection of concepts in a simplified form, the concepts further described below in the Detailed Description. The Summary is not intended to identify key features or essential features of the claimed subject matter, nor is the Summary intended as an aid in determining the scope of the claimed subject matter.

In some approaches, a method includes providing a device, the device including a plurality of angled structures formed from a substrate, a bitline and a dielectric between each of the plurality of angled structures, and a drain disposed along each of the plurality of angled structures. The method may further include providing a plurality of mask structures of a patterned masking layer over the plurality of angled structures, the plurality of mask structures being oriented perpendicular to the plurality of angled structures. The method may further include etching the device at a non-zero angle to form a plurality of pillar structures.

In some approaches, a dynamic random-access memory (DRAM) device may include a plurality of pillar structures formed from a substrate, wherein each of the plurality of pillar structures is oriented at a first non-zero angle relative to a perpendicular to a plane defined by a top surface of the substrate, and wherein each of the plurality of pillar structures is oriented at a second non-zero angle relative to the perpendicular to the plane defined by the top surface of the substrate. The DRAM device may further include a plurality of wordlines extending across the plurality of pillar structures, wherein the plurality of wordlines wrap entirely around each of the plurality of pillar structures.

In some approaches, a method of forming a dynamic random-access memory (DRAM) device may include providing a device, the device having a plurality of angled structures formed from a substrate, the plurality of angled structures oriented at a first non-zero angle relative to a perpendicular to a top surface of the substrate. The device may further include a bitline and a dielectric between each of the plurality of angled structures, and a drain disposed along a lower portion of each of the plurality of angled structures. The method may further include providing a plurality of mask structures of a patterned masking layer over the plurality of angled structures, the plurality of mask structures being oriented perpendicular to the plurality of angled structures. The method may further include etching the device at a second non-zero angle to form a plurality of pillar structures, and forming a plurality of wordlines along the plurality of pillar structures, wherein the plurality of wordlines wrap entirely around each of the plurality of pillar structures.

BRIEF DESCRIPTION OF THE DRAWINGS

The accompanying drawings illustrate exemplary approaches of the disclosed embodiments so far devised for the practical application of the principles thereof.

Figure 1:
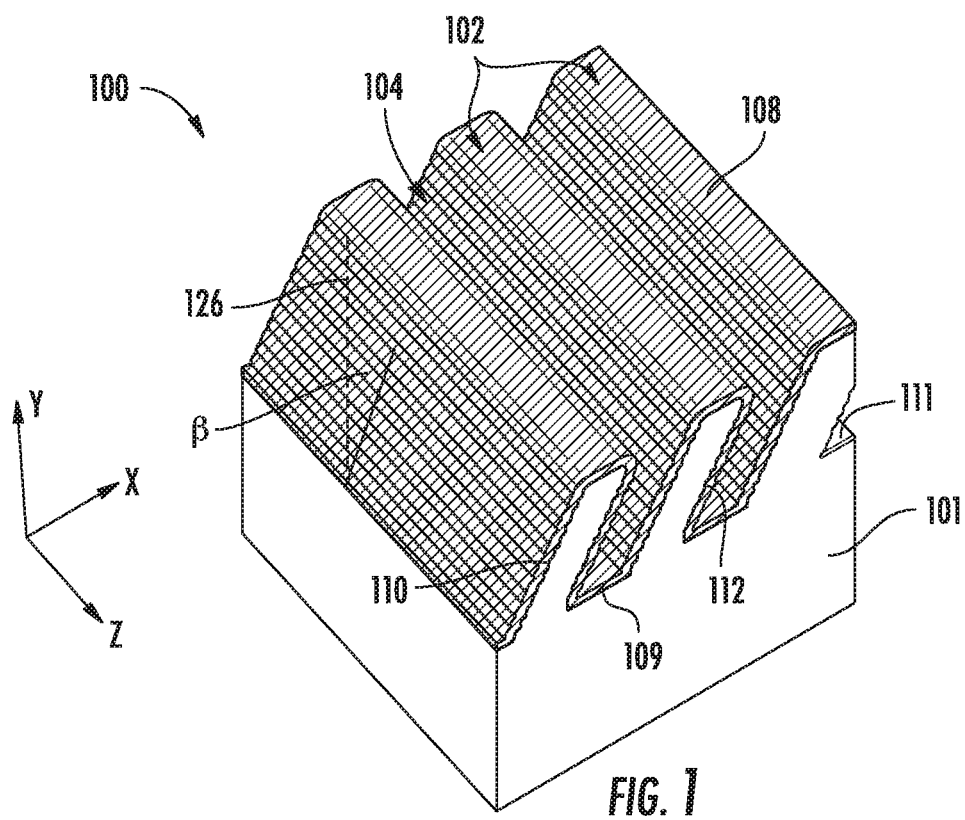
FIG. 1 is a perspective view of a device including a substrate and a plurality of angled structures in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

The present embodiments provide novel devices and methods for forming such devices, such as transistors, formed from semiconductor fin structures. These approaches may be especially applicable to formation of DRAM devices, while other devices may also be formed according to the embodiments of the disclosure. Various non-limiting embodiments are particularly useful for implementation where the width of fin structures or pitch between fin structures is less than 50 nm, and in some embodiments, 20 nm or less. Embodiments herein provide new integrations to effectively remove accumulated holes, which requires lateral doping to drain with high concentration. By providing an asymmetrical wraparound gate, operating range is increased, which provides a wider Ioff compared to Ion. The wraparound gate is beneficial because parasitic currents from other devices near the transistor make turning off the transistor more difficult.

Turning now to FIG. 1, there is shown a device 100, such as a dynamic random-access memory (DRAM) device, according to embodiments of the disclosure. The device 100 may include a plurality of angled structures 102 separated by a plurality of trenches 104. The plurality of angled structures 102 may be formed by etching a substrate 101, for example, using an angled ion etch. In exemplary embodiments, the plurality of angled structures 102 may be an array of fin structures having a length extending along a first direction (such as parallel to the z-axis of the Cartesian coordinate system shown), a height extending along a second direction (y-axis), and a width extending along a third direction (x-axis). According to various embodiments of the disclosure, the angled structures 102 are monolithically formed with the same material as the substrate 101. As will be appreciated, the device 100 may be used to make transistors and arrays of devices, such as DRAM arrays, having superior properties, including more uniformity in performance between devices, higher device yield, and so forth.

As shown in FIG. 1, the device 100 may include a first spacer layer 108 conformally formed over the substrate 101, including over all exposed surfaces of the angled structures 102 and a bottom surface 109 of each trench 104. The first spacer layer 108 may be deposited over a first sidewall 110 and a second sidewall 112 of each of the angled structures 102. As will be described in greater detail herein, each angled structure 102 is oriented at a first non-zero angle (n), in a first plane (x-y plane), relative to a perpendicular 126 from a plane (e.g., x-z plane) defined by a top surface 111 of the substrate 101. As shown, the perpendicular 126 may generally be parallel to the y-axis. Advantageously, the angled structures 102 are slanted or tilted (e.g., along the x-axis) so the second sidewall 112 extends partially or fully over an adjacent trench 104.

Figure 2:
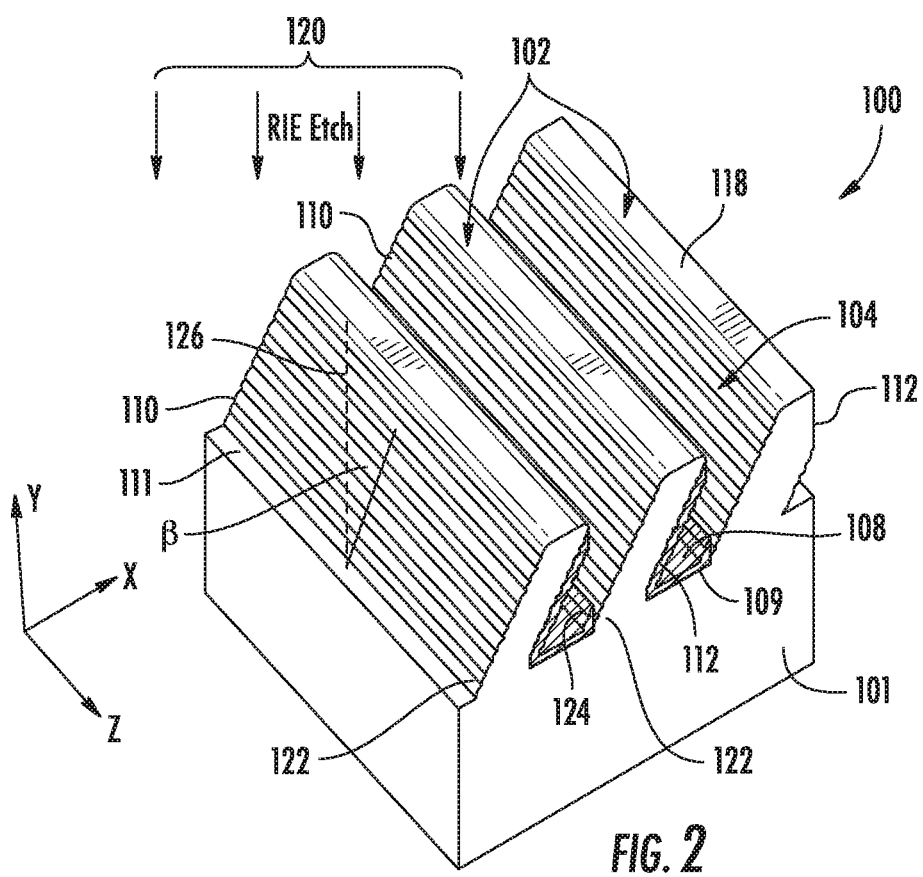
FIG. 2 is a perspective view of the device following an etch process in accordance with embodiments of the present disclosure.

Next, as shown in FIG. 2, the first spacer layer 108 may be removed from the angled structures 102, including from the first sidewall 110 and from a top surface 118 thereof. In some embodiments, the first spacer layer 108 may be etched, for example, using a vertical reactive ion etch (RIE) process 120. Due to the angle of the angled structures 102 extending over each trench 104, the first spacer layer 108 may not be removed by the vertical RIE 120 from the bottom surface 109 of each trench 104 or from a base 122 between the first sidewall 110 and the bottom surface 109. As shown, a footing 124 of the first spacer layer 108, which extends partially up the first sidewall 110, may remain in place.

It will be appreciated that the presence and/or size of the footing 124 may be influenced by the non-zero angle (β) of the angled structures 102 and/or the angle of the RIE 120 relative to the perpendicular 126. For example, a larger/greater non-zero angle of incidence between the second sidewall 112 and the perpendicular 126 means the angled structures 102 extend farther over the trenches 104, thus preventing the vertical RIE from reaching more of the first spacer layer 108 along the trenches 104 and the first sidewalls 110.

Figure 3:
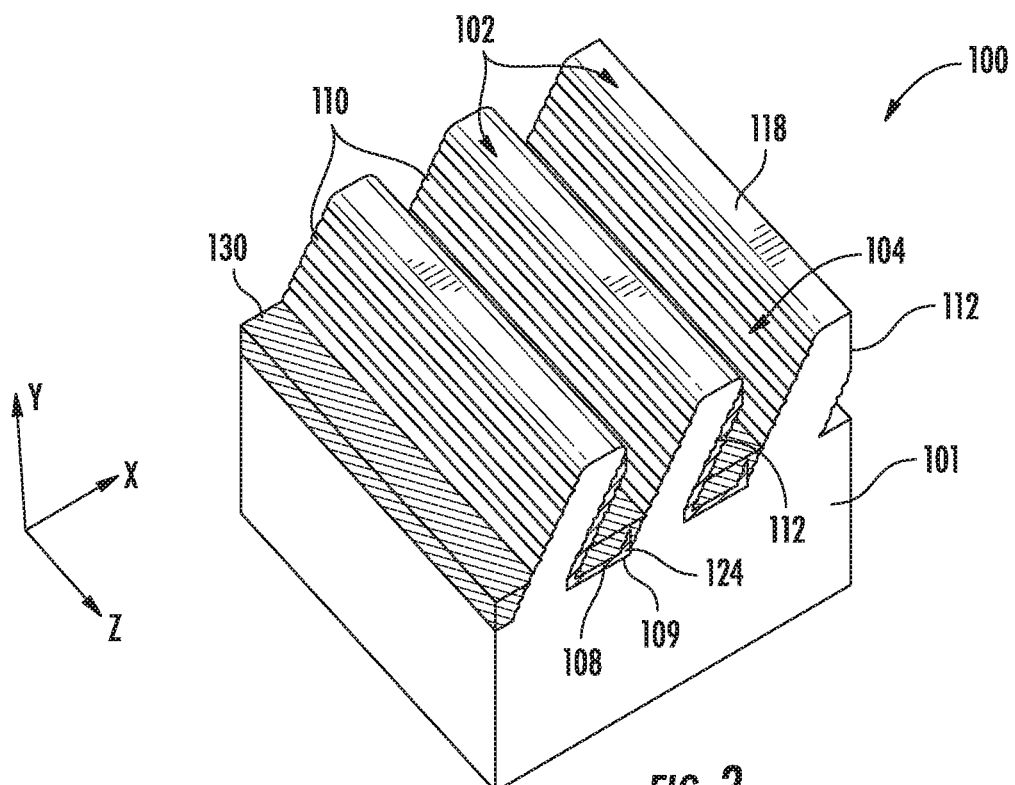
FIG. 3 is a perspective view of the device following a dielectric layer deposition and recess process in accordance with embodiments of the present disclosure.

As depicted in FIG. 3, a dielectric layer 130 may be formed over the first spacer layer 108 along the bottom surface 109 of each of the trenches 104. In some embodiments, the dielectric layer 130 may be deposited and then recessed to a desired depth/height. As shown, the dielectric layer 130 extends partially up the first and second sidewalls 110, 112 to a point above the footing 124 of the first spacer layer 108. Although non-limiting, the dielectric layer 130 may be silicon oxide, nitride, or other type of film/material.

Figure 4:
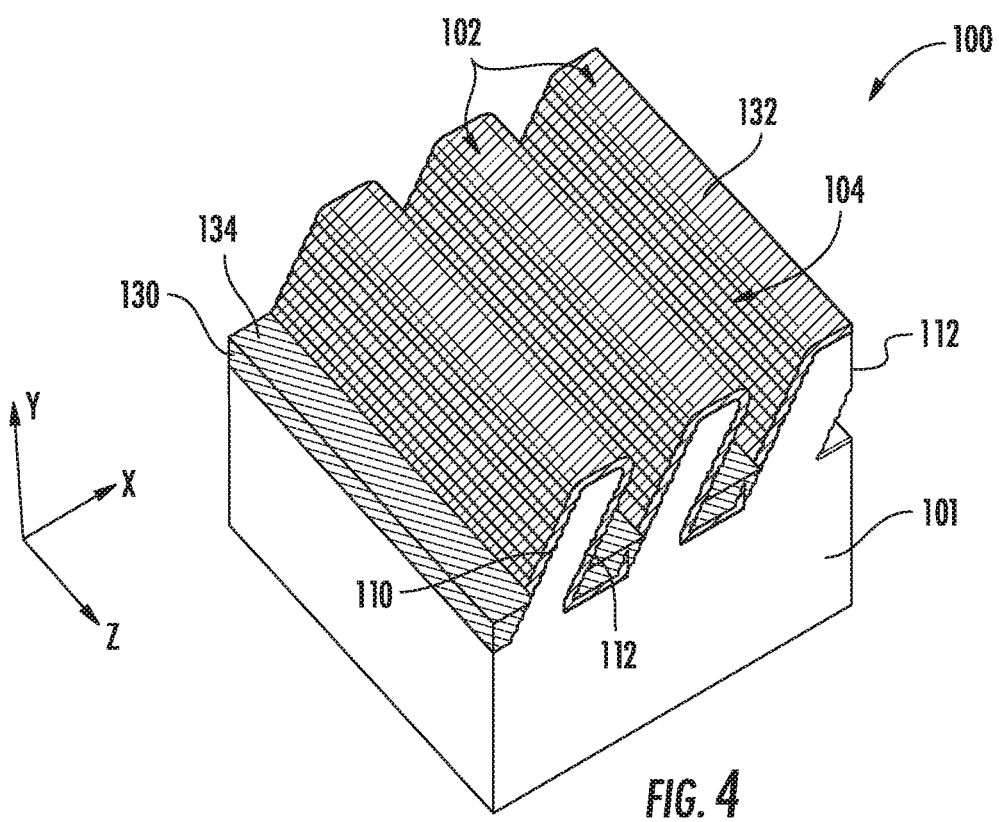
FIG. 4 is a perspective view of the device following removal of a portion of a spacer in accordance with embodiments of the present disclosure.
Figure 5:
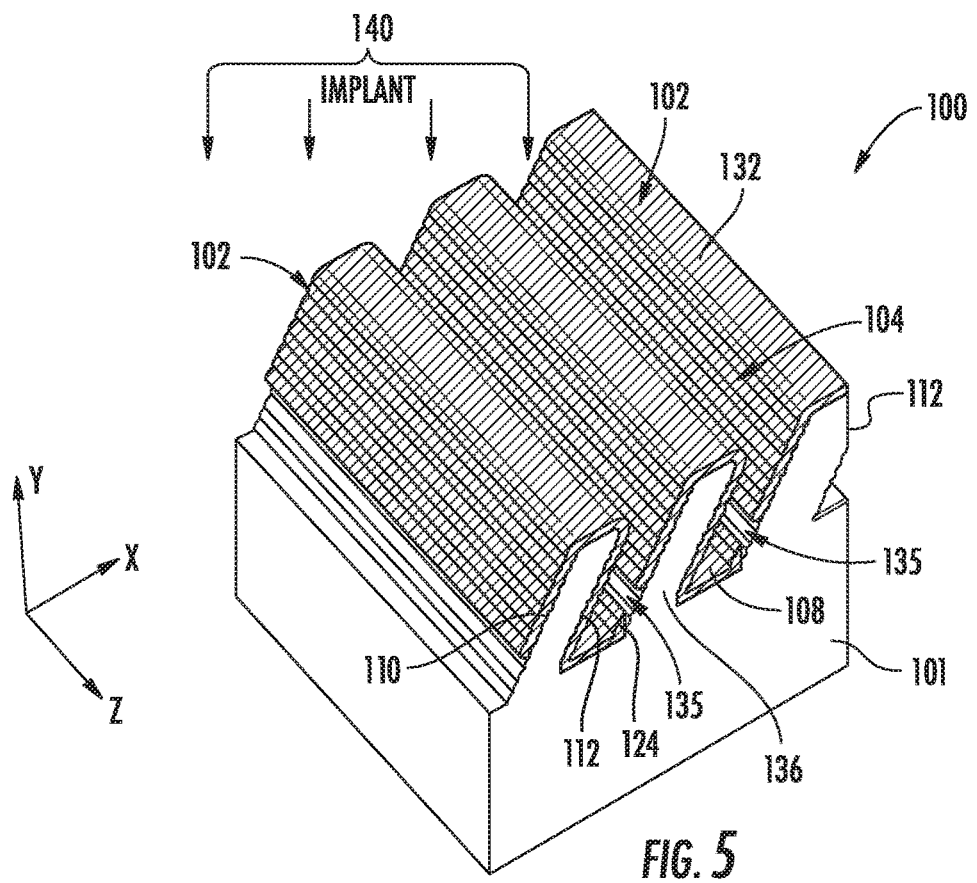
FIG. 5 is a perspective view of the device during an ion implant in accordance with embodiments of the present disclosure.
Figure 6:
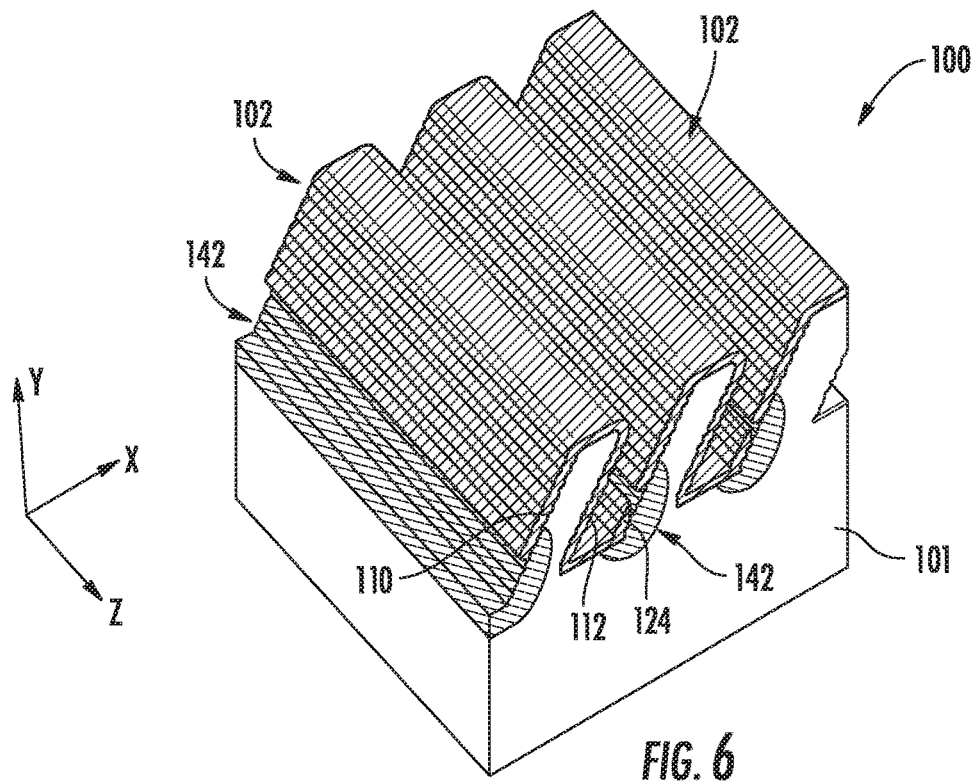
FIG. 6 is a perspective view of the device after formation of a plurality of drains in accordance with embodiments of the present disclosure.

As shown in FIG. 4, a second spacer layer 132 may then be formed over the angled structures 102. The second spacer layer 132 may extend along the first and second sidewalls 110, 112 to a top surface 134 of the dielectric layer 130. Once the dielectric layer 130 is removed, as demonstrated in FIG. 5, an opening 135 at a bottom portion 136 of each first sidewall 110 may be present. The opening 135 may separate the footing 124 of the first spacer layer 108 from the second spacer layer 132. A subsequent ion implant 140 to the device 100 will impact the first sidewalls 110 through each opening 135, resulting in a drain 142 being formed in each angled structure 102, as shown in FIG. 6. The ion implant 140 may be an epi plasma doping (PLAD) or beamline implant.

Although shown as a single implant, it will be appreciated that the ion implant 140 may include a series of multiple implants. For example, in some non-limiting embodiments, the ion implant 140 may first include a deep phosphorous implant to isolate Pwell followed by boron implant for the Pwell, e.g., for array access devices. A voltage for the boron implant may then be raised to reduce row hammer, which is an issue seen in DRAM devices due to frequent turning on or off of adjacent cells, followed by a source/drain (S/D) P implant and a S/D As implant. Next, a Ge implant into poly silicon may be performed to form a storage node contact, while also reducing interface resistance by amorphization. A blanket P implant for NMOS may then be performed, wherein PMOS may be counter doped at a later stage. Finally, the device 100 may be heated, for example, by a 1000 C rapid thermal anneal (RTA). In some non-limiting embodiments, the RTA may be performed for approximately 10 seconds in 1% O2 to activate dopants.

Figure 7:
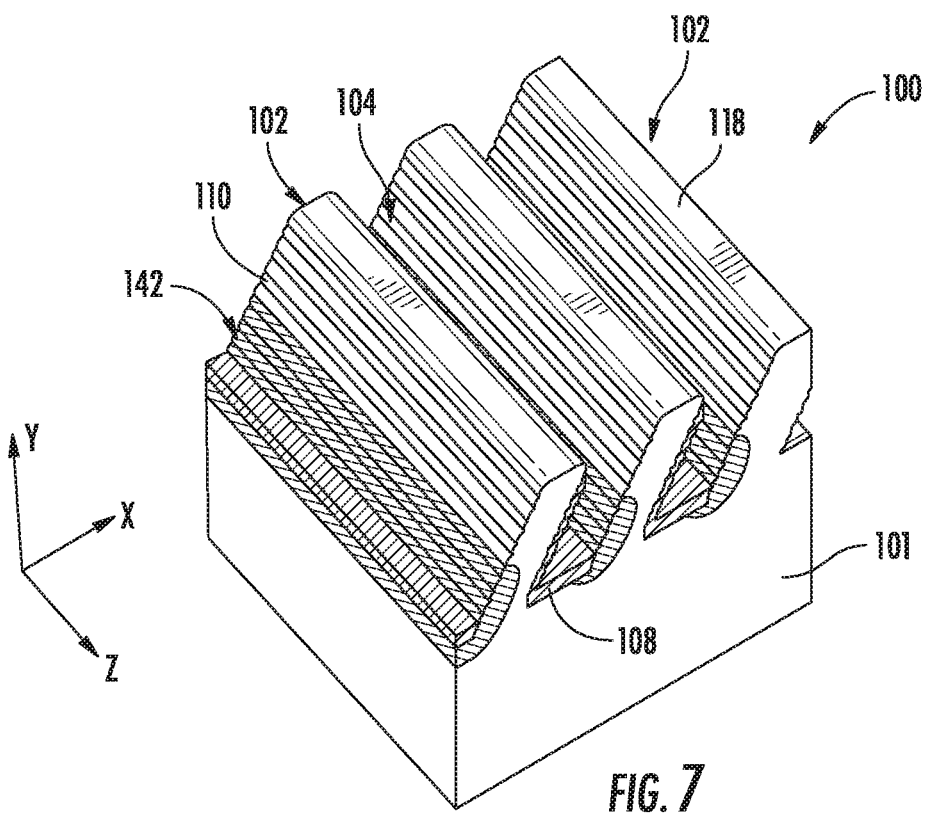
FIG. 7 is a perspective view of the device after removal of the spacer in accordance with embodiments of the present disclosure.
Figure 8:
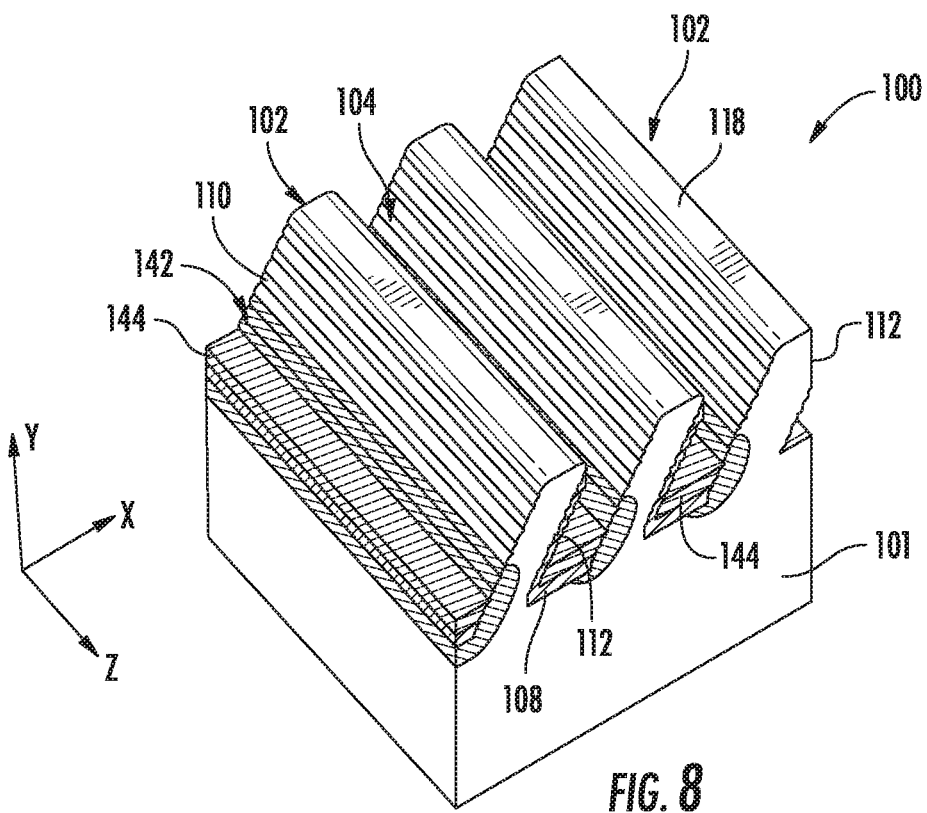
FIG. 8 is a perspective view of the device after a bitline deposition and recess process in accordance with embodiments of the present disclosure.

Next, as shown in FIG. 7, the second spacer layer 132 may then be removed from the first sidewalls 110 and from the top surfaces 118 of each angled structure 102. In some embodiments, the first spacer layer 108 may remain atop the bottom surface 109 of each trench 104. The footing 124 (FIG. 6) of the first spacer layer 108 may be removed, however. As shown in FIG. 8, a bitline 144 may be formed over the first spacer layer 108 within each trench 104. In some embodiments, the bitline 144 may be a low resistance material, such as tungsten, titanium nitride, titanium, Ruthenium, Cobalt Molybdenum etc., which is deposited over the device 100 and recessed to a desired thickness/height within the trenches 104. As shown, the bitline 144 may extend partially up the first and second sidewalls 110, 112. However, a portion of each drain 142 may remain uncovered by the bitline 144 in some embodiments. Furthermore, a portion of the first spacer layer 108 remains exposed along the second sidewalls 112.

Figure 9:
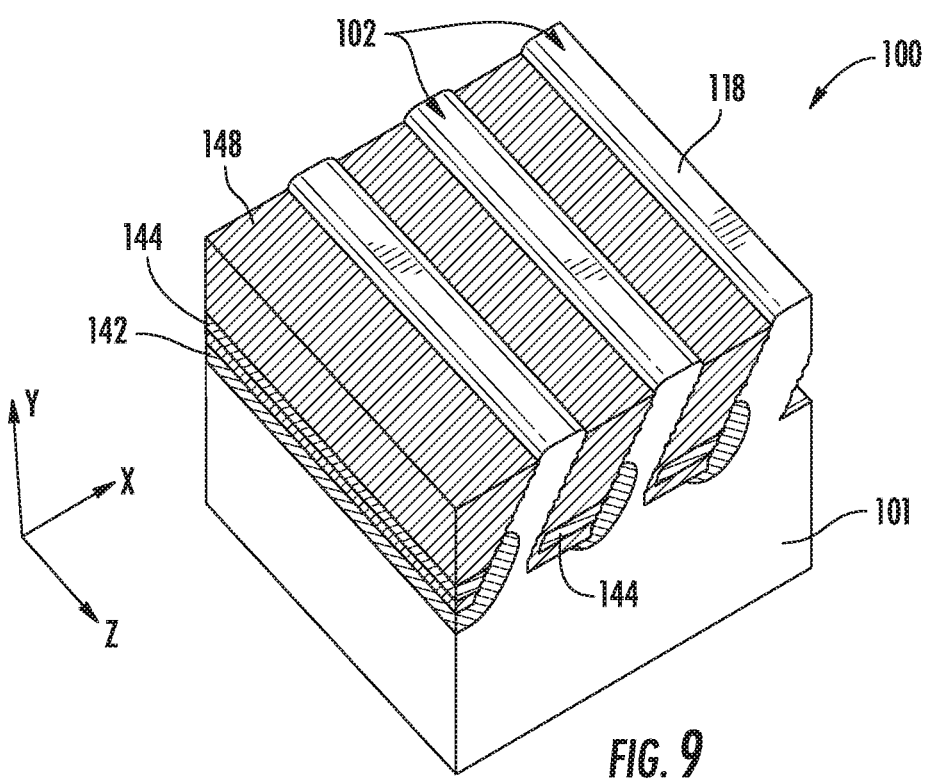
FIG. 9 is a perspective view of the device after a dielectric fill and planarization process in accordance with embodiments of the present disclosure.
Figure 10:
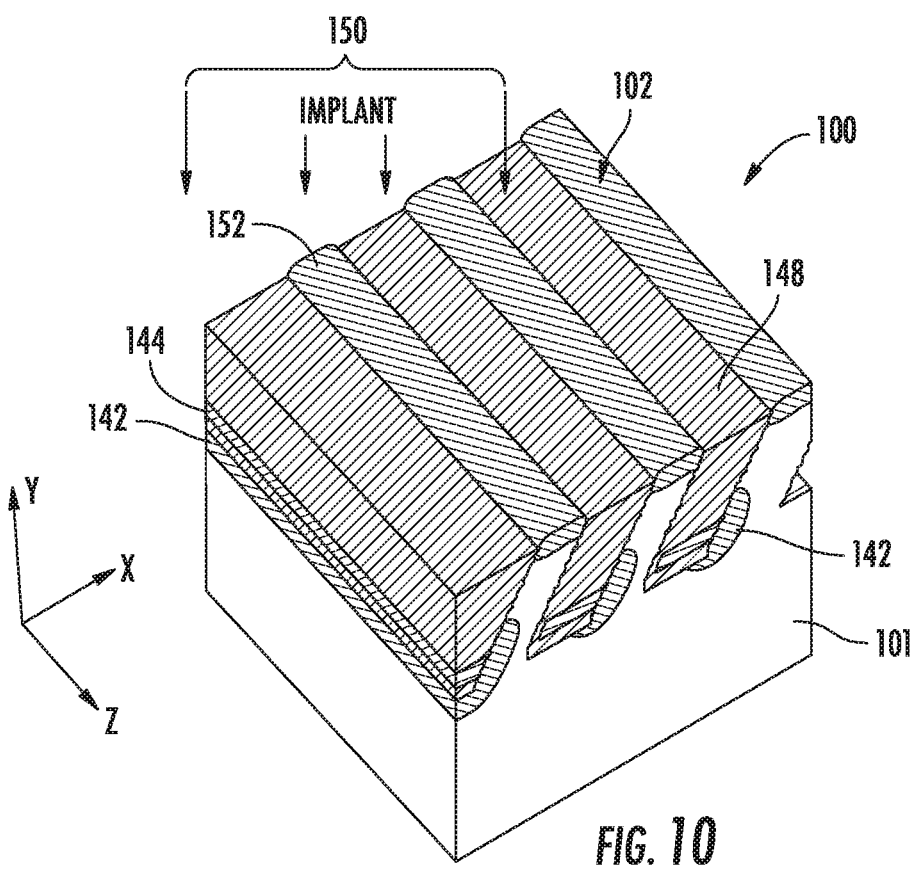
FIG. 10 is a perspective view of the device during a second ion implant in accordance with embodiments of the present disclosure.

As shown in FIG. 9, a first dielectric 148 may be deposited over the device 100, including over the bitline 144 within each of the trenches 104 (FIG. 8). The first dielectric 148 may then be planarized to a desired height, for example, planar or substantially planar with the top surface 118 of the angled structures 102. As shown in FIG. 10, second ion implant 150 may then be performed to form a source layer 152 atop each of the angled structures 102. In some embodiments, the second ion implant 150 may be a low-dose source/drain Phosphorous or Arsenic implant.

Figure 11:
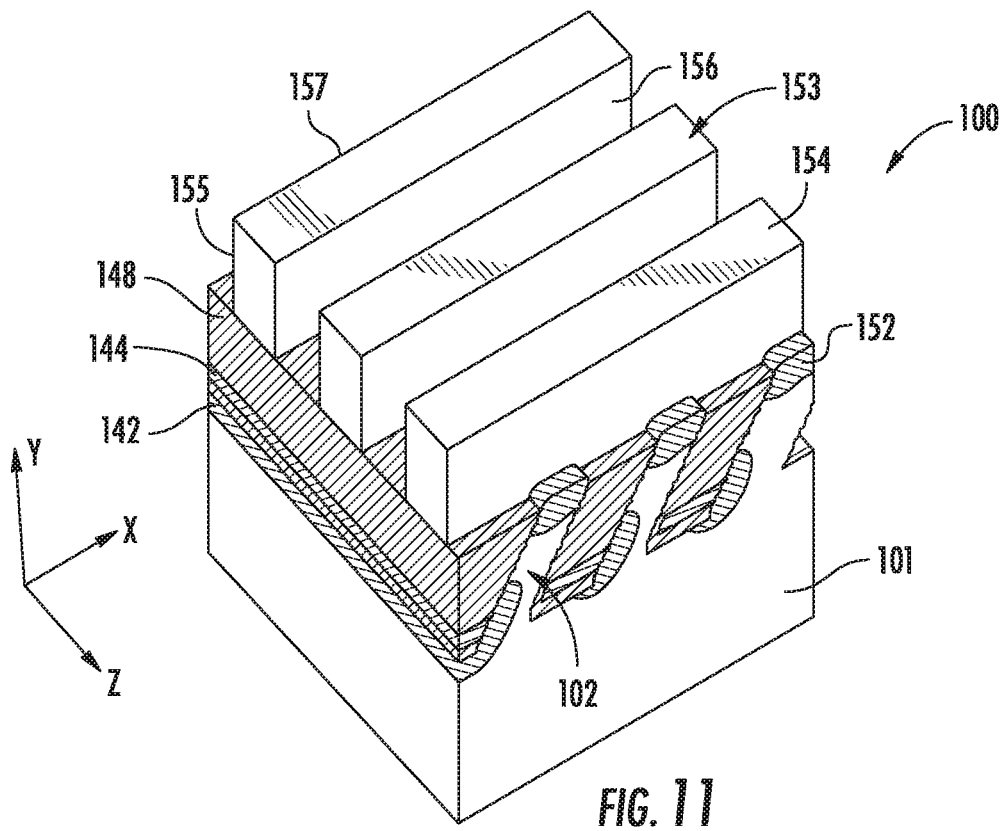
FIG. 11 is a perspective view of the device after formation of a patterned masking layer in accordance with embodiments of the present disclosure.

As shown in FIG. 11, a patterned masking layer 153 may be formed over the device 100, including over the angled structures 102, the first dielectric 148, and the source layer 152. As shown, the patterned masking layer 153 may include a plurality of mask structures 154 extending perpendicular to the angled structures 102, e.g., along the x-direction. Each of the mask structures 154 may include a first sidewall 155, a second sidewall 156, and a top surface 157.

Figure 12:
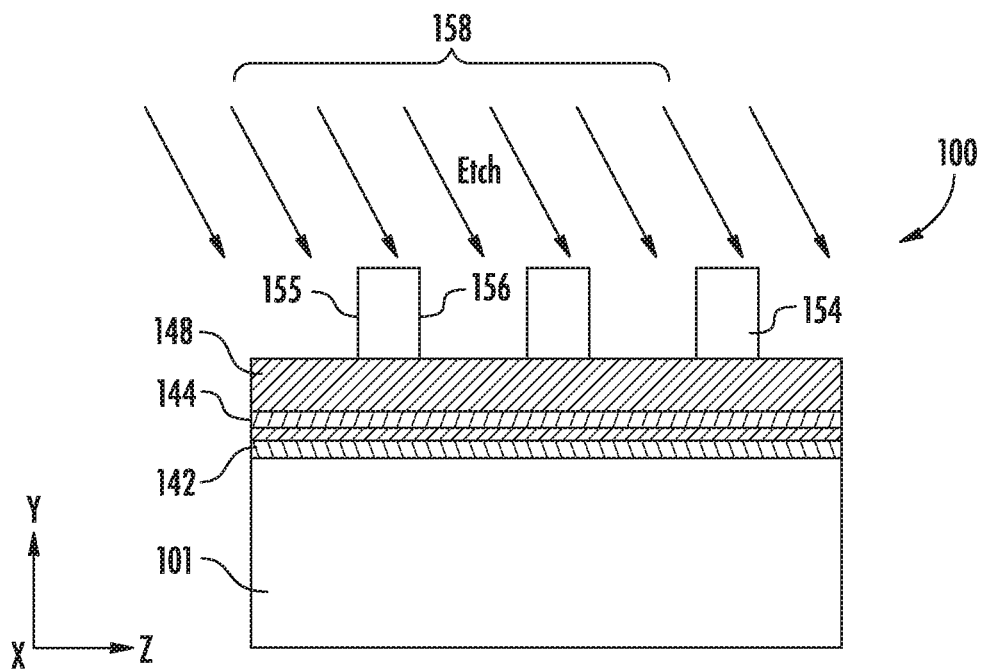
FIG. 12 is a side view of the device during an etch process in accordance with embodiments of the present disclosure.

As shown in FIG. 12, the device 100 may then receive an etch process 158 delivered at a non-zero angle with respect to a plane defined by the first and second sidewalls 155, 156 of the mask structures 154. The etch process 158 impacts the first dielectric 148 between each of the mask structures 154 to form a set of trenches (not shown) in the device 100. In some embodiments, the etch process 158 extends into the first dielectric 148 in an area beneath each of the mask structures 154. Furthermore, the etch process 158 may cut through the angled structures 102. In some embodiments, the etch process 158 is selective to the bitline 144.

Figure 13:
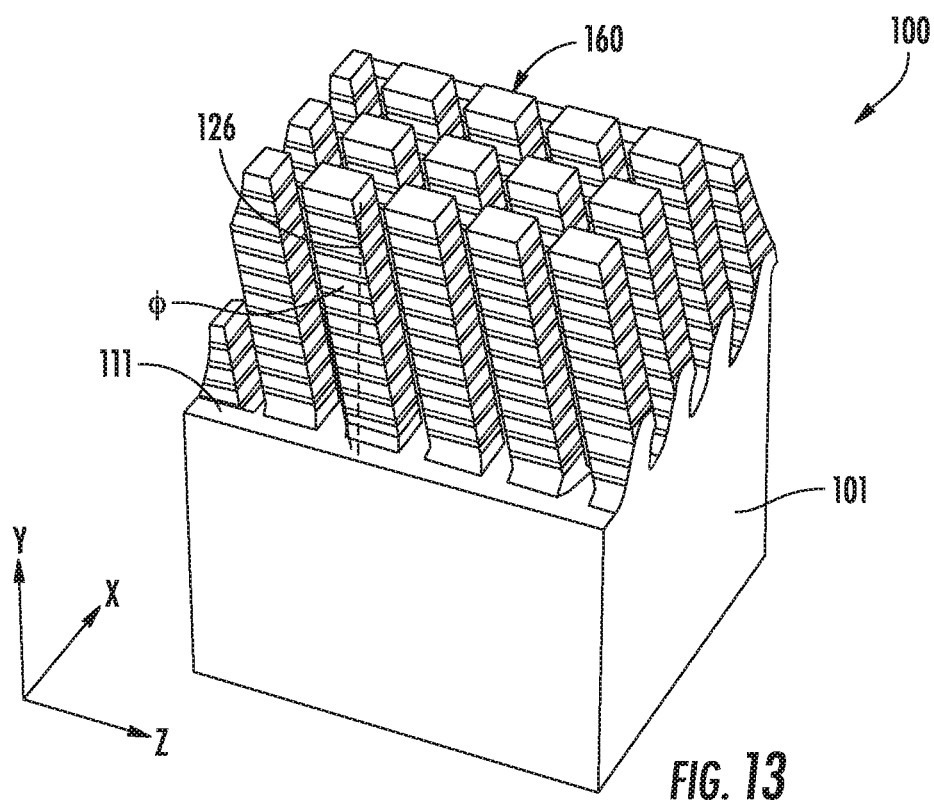
FIG. 13 is a perspective view of the device following formation of plurality of pillar structures in accordance with embodiments of the present disclosure.

Once the etch process 158 is complete, a plurality of pillar structures 160 are formed, as shown in FIG. 13. The pillar structures 160 may generally be angled or slanted in the x and −z directions. Said another way, each of the pillar structures 160 is oriented at a second non-zero angle (φ), in a second plane (y-z plane) relative to the perpendicular 126 extending from the top surface 111 of the substrate 101. As shown, the perpendicular 126 may generally be parallel to the y-axis. In some embodiments, the pillar structures 160 may be uniformly sized and spaced with respect to one another. For example, the pillar structures 160 may be arranged in a first series of rows aligned in the x-direction, and in a second series of rows aligned in the z-direction. Although not shown, it will be appreciated that the bitlines 144 and the drains 142 may be present atop the substrate 101. Additionally, the source layer 152 may be present atop each of the pillar structures 160.

Figure 14:
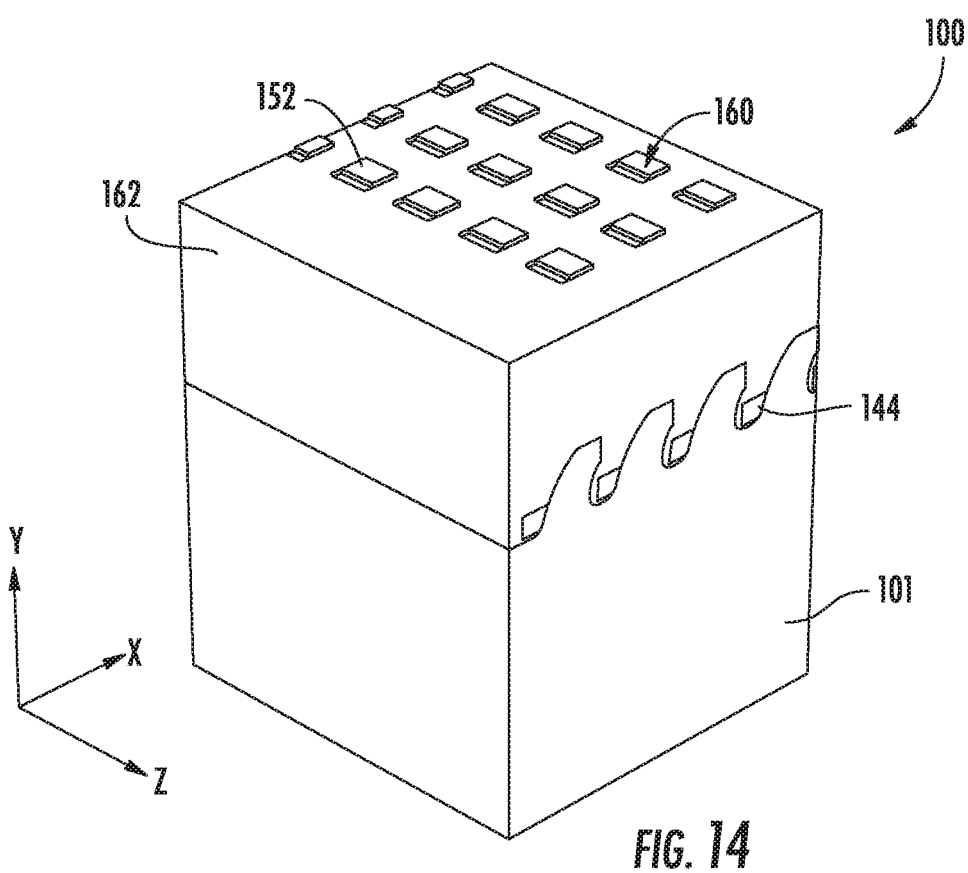
FIG. 14 is a perspective view of the device after an oxide fill in accordance with embodiments of the present disclosure.
Figure 15:
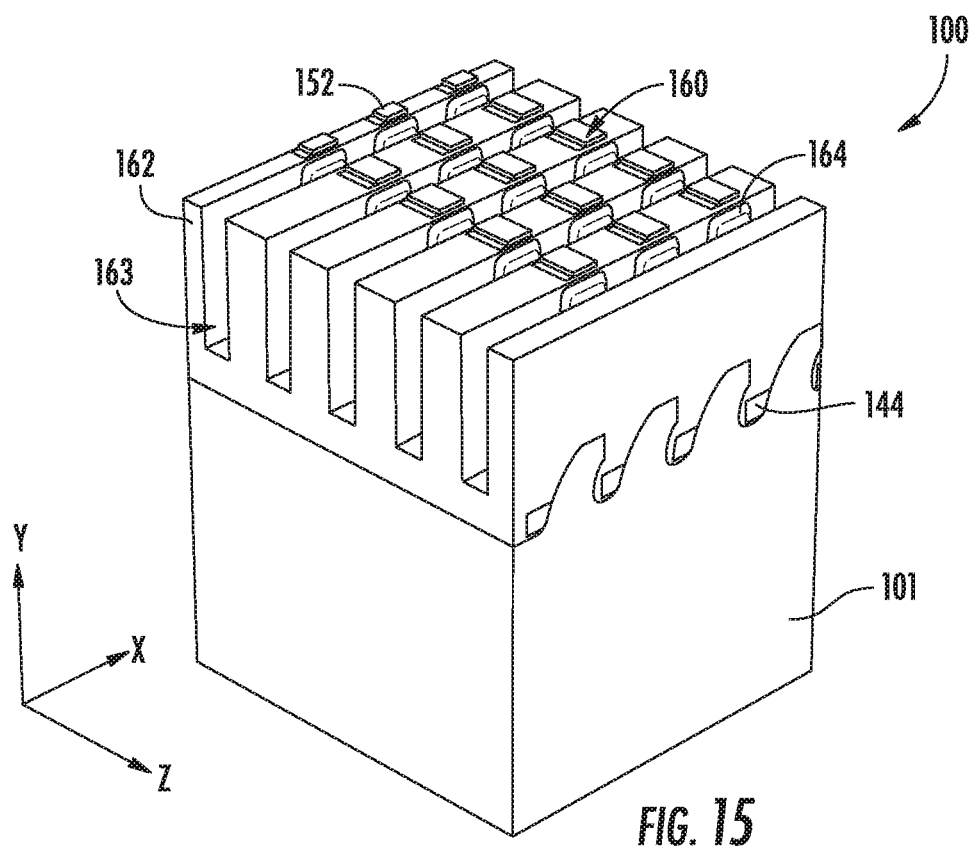
FIG. 15 is a perspective view of the device following formation of a plurality of oxide trenches in accordance with embodiments of the present disclosure.

As shown in FIG. 14, an oxide fill 162 is formed over the device 100 and planarized to expose the source layer 152 atop each of the pillar structures 160. A patterned mask (not shown) may then be formed over the oxide fill 162, and a plurality of oxide trenches 163 formed in the device 100, as shown in FIG. 15. The oxide trenches 163 may generally extend between the pillar structures 160, e.g., along the x-direction. In some embodiments, the oxide trenches 163 may be formed to expose one or more sidewalls 164 of the pillar structures 160.

Figure 16:
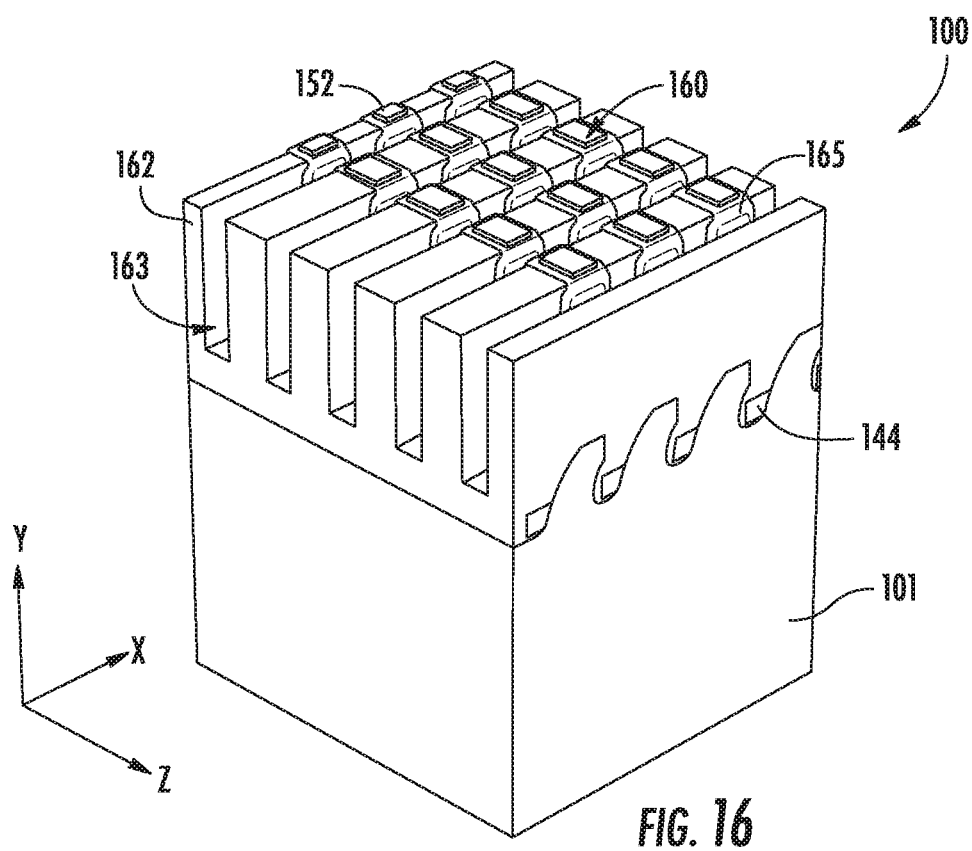
FIG. 16 is a perspective view of the device following formation of a gate oxide along the plurality of pillar structures in accordance with embodiments of the present disclosure.
Figure 17:
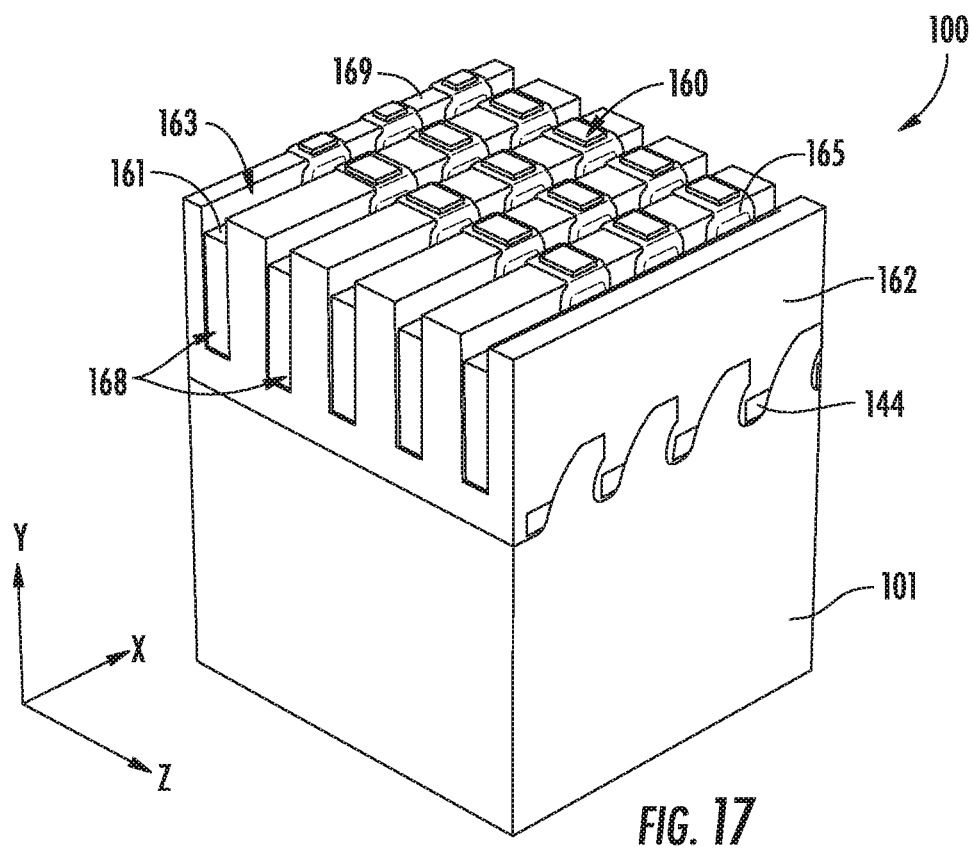
FIG. 17 is a perspective view of the device following formation of a gate metal within the oxide trenches in accordance with embodiments of the present disclosure.
Figure 18:
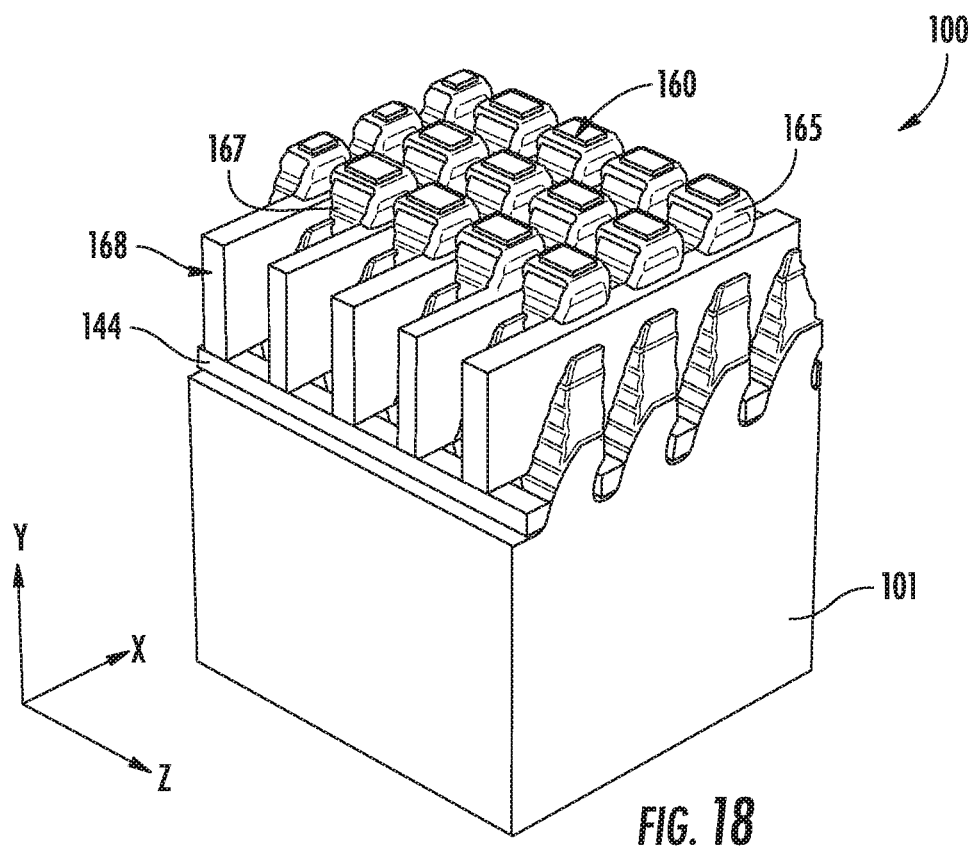
FIG. 18 is a perspective view of the device of FIG. 17 with the oxide fill removed in accordance with embodiments of the present disclosure.

As shown in FIG. 16, a gate oxide or dielectric 165 may be formed along the exposed sidewalls 164 of the pillar structures 160. In some embodiments, the gate dielectric 165 may be formed by a deposition and etch back process. A gate metal 161 may then be formed within the oxide trenches 163, as shown in FIG. 17, to form a series of wordlines 168. The gate metal 161 may be formed over the gate dielectric 165. In some embodiments, the gate metal 161 of the wordline 168 may be a low-resistance material, such as tungsten, titanium nitride, titanium, ruthenium, cobalt molybdenum, etc. As shown, the gate metal 161 of the wordlines 168 may be deposited and then removed (e.g., etched) to a desired height/thickness below a plane defined by a top surface 169 of the oxide fill 162. As shown, the wordlines 168 may extend partially up the plurality of pillar structures 160. Furthermore, the wordlines 168 may run parallel to the bitlines 144. FIG. 18 demonstrates the device 100 without the presence of the oxide fill 162. As shown, the gate dielectric 165 may not be formed along one or more surfaces 167 covered by the oxide fill 162.

Figure 19:
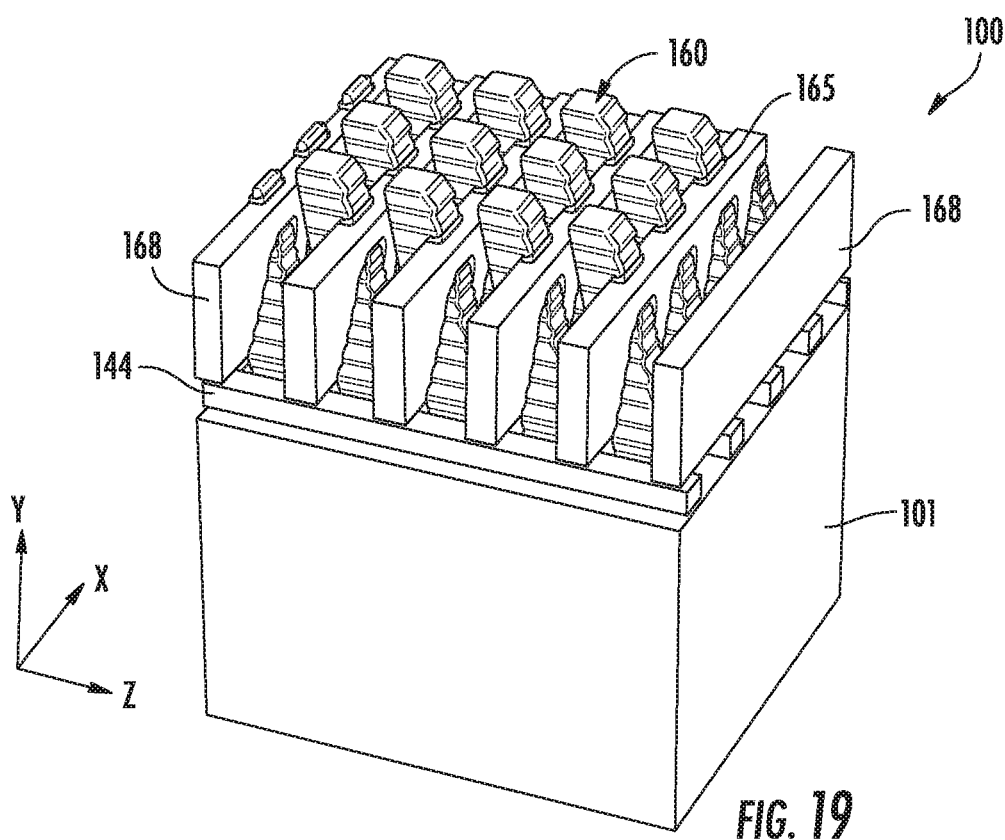
FIG. 19 is a perspective view of the device following removal of the gate dielectric from the pillar structures in accordance with embodiments of the present disclosure.
Figure 20:
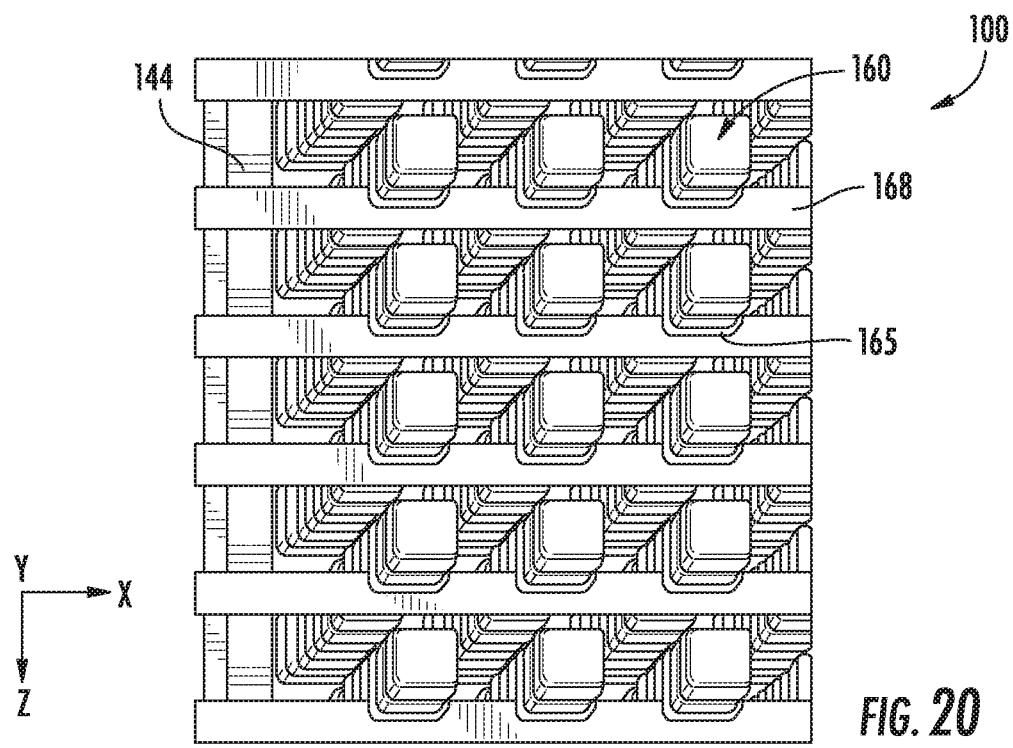
FIG. 20 is a top view of the device of FIG. 19 in accordance with embodiments of the present disclosure.

Next, as shown in FIGS. 19-20, the oxide fill 162 and a portion of the gate dielectric 165 may be removed from the device 100 following formation of the wordlines 168. As shown, the wordlines 168 may be generally vertically oriented, while the pillar structures 160 lean in the x and −z directions. In some embodiments, the gate dielectric 165 may remain between the wordlines 168 and the pillar structures 160. Once complete, the device 100 may be an improved $4F^2$ DRAM device having bitlines 144 tucked under the tilted/angled pillar structures 160 and the wordlines 168 present along each sidewall surface of each pillar structure 160, as will be described in greater detail below.

Figure 21:
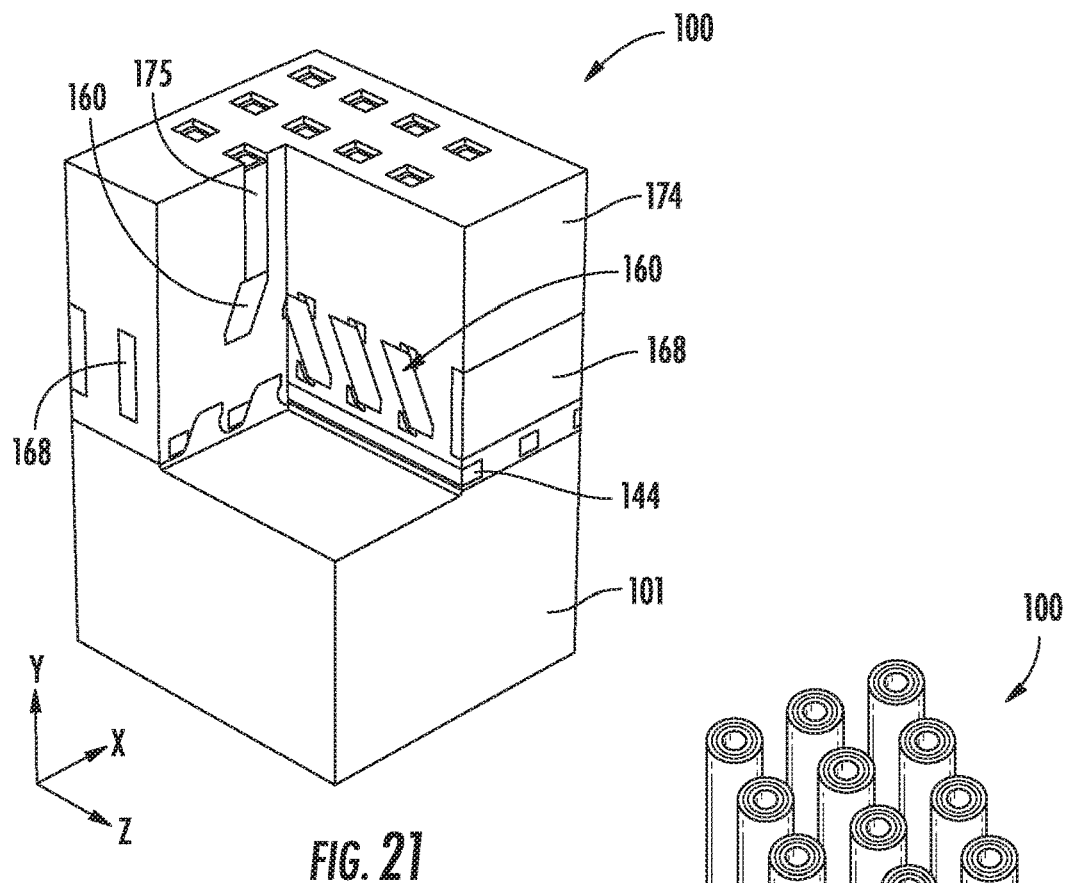
FIG. 21 is a perspective view of the device following formation of a dielectric fill and a plurality of drains, in accordance with embodiments of the present disclosure.
Figure 22:
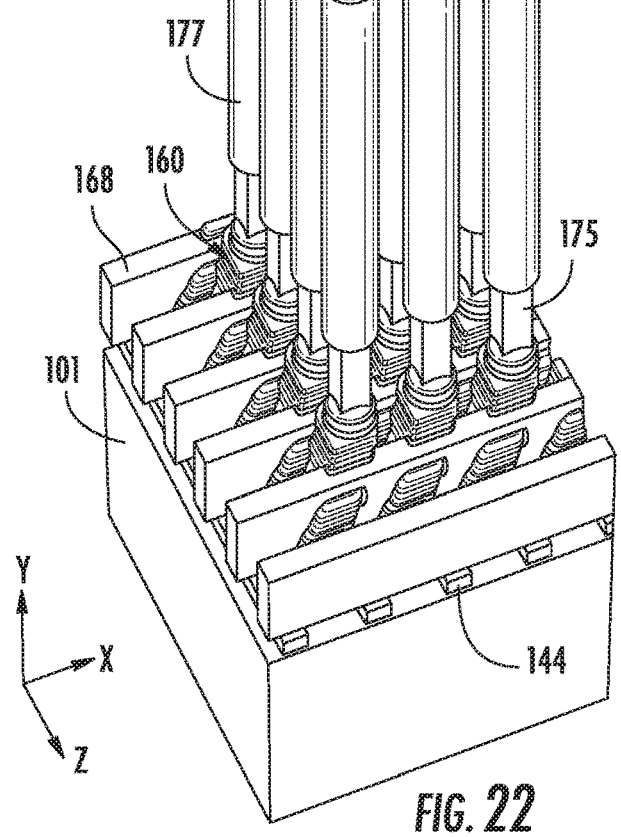
FIG. 22 is a perspective view of the device following formation of a plurality of capacitors along the plurality of drains, in accordance with embodiments of the present disclosure.

As shown in FIG. 21, a dielectric fill 174 is formed over the device 100, and a plurality of drains 175 are formed therein. As shown, the drains 175 connect to corresponding pillar structures 160. A portion of the device 100 has been removed to better depict connection between the drains 175 and the pillar structures 160, as well as the wordlines 168 wrapped around the pillar structures 160. Finally, as shown in FIG. 22, the dielectric fill 174 may be removed and a capacitor layer 177 formed along each of the drains 175.

Figure 23:
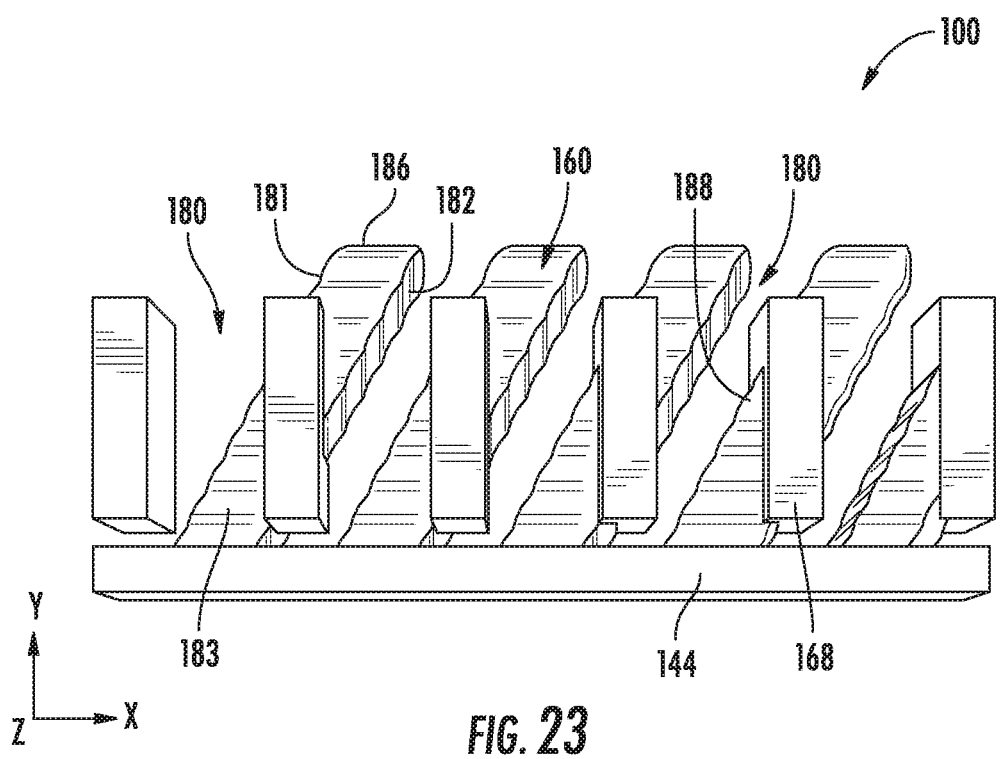
FIG. 23 is a side cross-sectional view of the plurality of pillar structures and the wordlines, in accordance with embodiments of the present disclosure.

Turning now to FIG. 23, a cross-sectional view of the device 100 according to embodiments of the present disclosure will be described in greater detail. It will be appreciated that not all components of the device 100 are shown for ease of viewing. As shown, the device 100 may include the plurality of pillar structures 160 separated by trenches 180. The pillar structures 160 generally extend vertically, at an angle in two directions (e.g., the x-direction and the z-direction). Each of the pillar structures 160 may be defined by a first sidewall 181, a second sidewall 182, a third sidewall 183, and a fourth sidewall (not shown), which is opposite the third sidewall 183. Although each of the pillar structures 160 is generally shown as a cuboid, it will be appreciated that other shapes may be possible in alternative embodiments.

Due to the angle and thickness (e.g., along the x-direction) of the plurality of pillar structures 160, each second sidewall 182 may extend over an adjacent trench 180. Furthermore, each bitline 144 may be tucked under the pillar structures 160, while the drains (not shown) can be doped by a vertical implant and/or a line of sight angled implant. In some embodiments, a phosphorous implant may be performed before or after fin etching to form wells in the device 100.

As further shown, the wordlines 168 may generally extend perpendicular to the bitlines 144 and parallel to the trenches 180. The wordlines 168 wrap around each of the pillar structures 160 such that the wordlines 168 extend along each of the first sidewall 181, the second sidewall 182, the third sidewall 183, and the fourth sidewall. In some embodiments, the gate dielectric 165 (not shown) is disposed between each of the wordlines 168 and the corresponding pillar structures 160 intersected by the wordlines 168. In this embodiment, the wordlines 168 are recessed below a top surface 186 of the pillar structures 160. As shown, due to the angle of the pillar structures 160, each wordline 168 may impact and/or cover the first sidewall 181 along an upper portion of the pillar structures 160, and may impact and/or cover the second sidewall 182 along a lower portion of the pillar structure 160. Said another way, the wordlines 168 may be present only along the upper portion of the first sidewall 181 of the pillar structures 160, but not along the lower portion of the first sidewall 181 of the pillar structures 160. Inversely, the wordlines 168 may be present only along the lower portion of the second sidewall 182 of the pillar structures 160, but not along the upper portion of the second sidewall 182 of the pillar structures 160. Similarly, due to the angle of the pillar structures 160, the wordlines 168 may be present more towards the upper portion of the third sidewall 183 and more towards the lower portion of the fourth surface. Although non-limiting, the upper and lower portions of each pillar structure 160 may be defined relative to a midpoint 188 generally extending halfway up each pillar structure 160.

In view of the foregoing, at least the following advantages are achieved by the embodiments disclosed herein. A first advantage is the elimination or reduction in hole accumulation into the body of the device due to the floating body effect, by providing a path for the holes. A second advantage is the reduction of off-leakage current, e.g., for vertical channel transistors. A third advantage, due to the wrap-around wordline gates, is a wider Ioff compared to Ion.

In various embodiments, design tools can be provided and configured to create the datasets used to pattern the semiconductor layers of the device 100, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device, comprising:
     a plurality of angled structures formed from a substrate;
     a bitline and a dielectric between each of the plurality of angled structures; and
     a drain disposed along each of the plurality of angled structures;
   providing a plurality of mask structures of a patterned masking layer over the plurality of angled structures, the plurality of mask structures being oriented perpendicular to the plurality of angled structures; and
   etching the device at a non-zero angle to form a plurality of pillar structures.

2. The method of claim 1, further comprising forming a wordline along each of the plurality of pillar structures, wherein the wordline wraps around each sidewall of each of the plurality of pillar structures.

3. The method of claim 1, further comprising etching the plurality of angled structures between each of the plurality of mask structures to form the plurality of pillar structures.

4. The method of claim 1, further comprising orienting the plurality of angled structures at a first non-zero angle, in a first plane, relative to a perpendicular to a plane defined by a top surface of the substrate of the device.

5. The method of claim 4, further comprising orienting the plurality of pillar structures at a second non-zero angle, in a second plane, relative to the perpendicular to the plane defined by the top surface of the substrate of the device.

6. The method of claim 1, further comprising:
   forming an oxide fill over the device including over the plurality of pillar structures;
   forming a plurality of oxide trenches in the oxide fill to expose one or more sidewalls of each of the plurality of pillar structures; and
   forming a gate dielectric along the one or more sidewalls of each of the plurality of pillar structures.

7. The method of claim 6, further comprising forming a gate metal within each of the plurality of oxide trenches.

8. The method of claim 1, further comprising:
   forming a spacer over the plurality of angled structures, wherein the spacer has an opening at a bottom portion of a first sidewall of each of the plurality of angled structures;
   forming a drain in each of the plurality of angled structures by performing an ion implant to the substrate, wherein the ion implant impacts the first sidewall through the opening at the bottom portion of the first sidewall;
   removing the spacer from the first sidewall; and
   forming the bitline over the spacer along a bottom surface of each of a plurality of trenches.

9. The method of claim 8, further comprising:
forming the dielectric over the bitline within each trench of the plurality of trenches; and
performing a second ion implant to form a source atop each of the plurality of angled structures.

10. The method of claim 8, wherein performing the ion implant to the substrate comprises implanting the substrate at a non-zero angle of incidence with respect to a perpendicular extending from a plane defined by a top surface of the substrate.

11. A dynamic random-access memory (DRAM) device, comprising:
a plurality of pillar structures formed from a substrate, wherein each of the plurality of pillar structures is oriented at a first non-zero angle relative to a perpendicular to a plane defined by a top surface of the substrate, and wherein each of the plurality of pillar structures is oriented at a second non-zero angle relative to the perpendicular to the plane defined by the top surface of the substrate; and
a plurality of wordlines extending across the plurality of pillar structures, wherein the plurality of wordlines wrap entirely around each of the plurality of pillar structures.

12. The DRAM device of claim 11, wherein each of the plurality of pillar structures includes a plurality of sidewalls, and wherein the plurality of wordlines extend along each of the plurality of sidewalls.

13. The DRAM device of claim 11, further comprising a plurality of bitlines formed atop the substrate, wherein the plurality of bitlines is oriented perpendicular to the plurality of wordlines.

14. The DRAM device of claim 11, further comprising a gate dielectric disposed between the plurality of wordlines and the plurality of pillar structures.

15. A method of forming a dynamic random-access memory (DRAM) device, comprising:
providing a device, comprising:
a plurality of angled structures formed from a substrate, the plurality of angled structures oriented at a first non-zero angle relative to a perpendicular to a top surface of the substrate;
a bitline and a dielectric between each of the plurality of angled structures; and
a drain disposed along a lower portion of each of the plurality of angled structures;
providing a plurality of mask structures of a patterned masking layer over the plurality of angled structures, the plurality of mask structures being oriented perpendicular to the plurality of angled structures;
etching the device at a second non-zero angle to form a plurality of pillar structures; and
forming a plurality of wordlines along the plurality of pillar structures, wherein the plurality of wordlines wrap entirely around each of the plurality of pillar structures.

16. The method of claim 15, further comprising etching the plurality of angled structures between each of the plurality of mask structures to form the plurality of pillar structures.

17. The method of claim 15, further comprising:
forming an oxide fill over the device including over the plurality of pillar structures;
forming a plurality of oxide trenches in the oxide fill to expose one or more sidewalls of each of the plurality of pillar structures;
forming a gate dielectric along the one or more sidewalls of each of the plurality of pillar structures; and
forming a gate metal within each of the plurality of oxide trenches.

18. The method of claim 15, further comprising:
forming a spacer over the plurality of angled structures, wherein the spacer has an opening at a bottom portion of a first sidewall of each of the plurality of angled structures;
forming a drain in each of the plurality of angled structures by performing an ion implant to the substrate, wherein the ion implant impacts the first sidewall through the opening at the bottom portion of the first sidewall;
removing the spacer from the first sidewall; and
forming the bitline over the spacer along a bottom surface of each of a plurality of trenches.

19. The method of claim 18, further comprising:
forming the dielectric over the bitline within each trench of the plurality of trenches; and
performing a second ion implant to form a source atop each of the plurality of angled structures.

20. The method of claim 18, further comprising performing the ion implant to the substrate comprises implanting the substrate at a non-zero angle of incidence with respect to a perpendicular extending from a plane defined by a top surface of the substrate.

* * * * *